United States Patent
Kawano

(10) Patent No.: US 7,205,796 B2
(45) Date of Patent: Apr. 17, 2007

(54) AND CIRCUIT

(75) Inventor: Yoichi Kawano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 11/045,475

(22) Filed: Jan. 31, 2005

(65) Prior Publication Data
US 2006/0061392 A1    Mar. 23, 2006

(30) Foreign Application Priority Data
Sep. 17, 2004    (JP)    ............................. 2004-271782

(51) Int. Cl.
*H03K 19/20*    (2006.01)
(52) U.S. Cl. ...................................... 326/115; 326/119
(58) Field of Classification Search ................ 326/104, 326/109, 112, 115, 119, 121, 124–127
See application file for complete search history.

(56) References Cited

U.S. PATENT DOCUMENTS 5,220,212 A * 6/1993 Sinh ........................... 326/126
5,334,887 A * 8/1994 Kurashima .................. 326/126
5,969,579 A * 10/1999 Hartke et al. ................ 332/116
6,414,519 B1 * 7/2002 Abernathy ................... 326/127
6,680,625 B1 * 1/2004 Lee et al. .................... 326/115
6,700,413 B1 * 3/2004 Chou .......................... 326/127

FOREIGN PATENT DOCUMENTS

JP    02246615 A    2/1990

* cited by examiner

*Primary Examiner*—Don Le
(74) *Attorney, Agent, or Firm*—Arent Fox PLLC

(57) ABSTRACT

An AND circuit is provided, which has a first differential pair including a first transistor and a second transistor, to which a first input differential signal is inputted, a second differential pair including a third transistor and a fourth transistor, to which a fixed bias is inputted, a third differential pair including a fifth transistor and a sixth transistor, to which a second input differential signal is inputted, and in which the first differential pair is connected to the fifth transistor and the second differential pair is connected to the sixth transistor, and an output terminal, which is connected to the first or second transistor and outputs an AND signal or a NAND signal of the first and second input differential signals.

18 Claims, 5 Drawing Sheets

F I G. 4
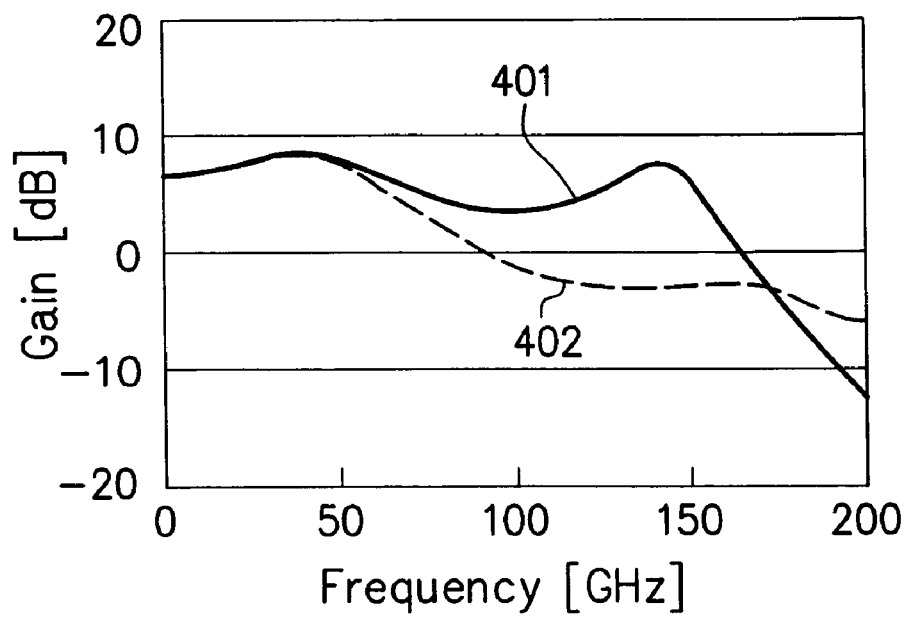
F I G. 5
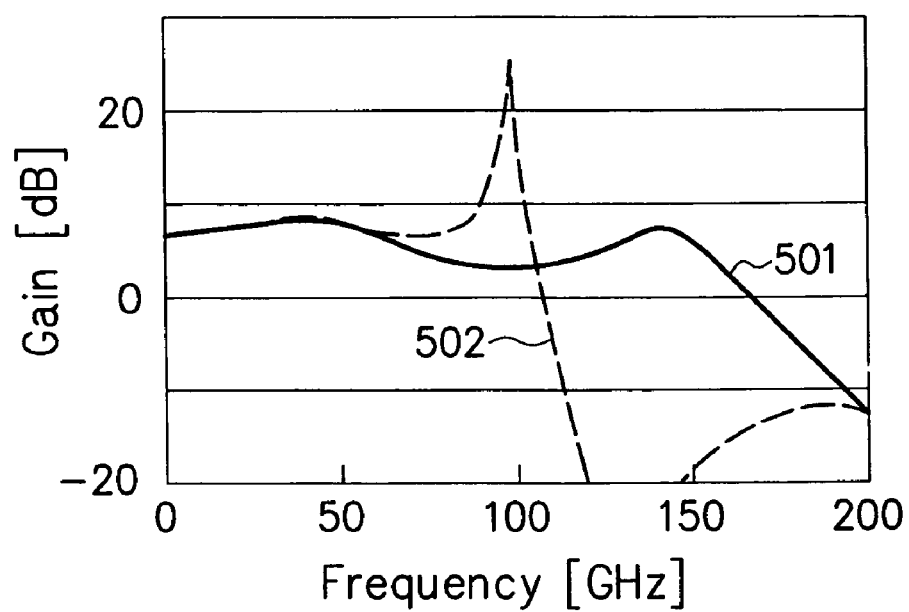

AND CIRCUIT

CROSS-REFERENCE TO RELATED APPLICATIONS

This application is based upon and claims the benefit of priority from the prior Japanese Patent Application No. 2004-271782, filed on Sep. 17, 2004, the entire contents of which are incorporated herein by reference.

BACKGROUND OF THE INVENTION

1. Field of the Invention

The present invention relates to an AND (logical product) circuit and more particularly, to an AND circuit to which an input differential signal is inputted.

2. Description of the Related Art

In the following Patent document 1, an AND circuit in which differential pairs of transistors are stacked vertically is described. In general, a two-input AND circuit outputs an AND signal of first and second input signals. When both the first and the second input signals are at the LOW level, the output signal is at the LOW level. When the first input signal is at the LOW level and the second input signal is at the HIGH level, the output signal is at the LOW level. When the first input signal is at the HIGH level and the second input signal is at the LOW level, the output signal is at the LOW level. When both the first and the second outputs are at the HIGH level, the output signal is at the HIGH level. In FIG. 3 in Patent document 1, a circuit in which a diode is provided in an AND circuit including two differential pairs stacked vertically is shown.

(Patent Document 1) Japanese Patent Application Laid-open No. Hei 2-246615.

SUMMARY OF THE INVENTION

An object of the present invention is to provide an AND circuit capable of fast operation and preventing from deterioration of output waveform.

According to an aspect of the present invention, an AND circuit is provided, which comprises: a first differential pair including a first transistor and a second transistor, to which a first input differential signal is inputted; a second differential pair including a third transistor and a fourth transistor, to which a fixed bias is inputted; a third differential pair including a fifth transistor and a sixth transistor, to which a second input differential signal is inputted, and in which the first differential pair is connected to the fifth transistor and the second differential pair is connected to the sixth transistor; and an output terminal, which is connected to the first or second transistor and outputs an AND signal or a NAND signal of the first and second input differential signals.

BRIEF DESCRIPTION OF THE DRAWINGS

FIG. 4 is a diagram that shows the frequency characteristics, which are the small-signal analysis results, of a transistor Tnb in the circuit according to the present embodiment in FIG. 1 and of that in a circuit in FIG. 8.

FIG. 5 is a diagram that shows the frequency characteristics, which are the small-signal analysis results, of a transistor Tnb in the circuit according to the present embodiment in FIG. 1.

DETAILED DESCRIPTION OF THE PREFERRED EMBODIMENTS

Figure 6:
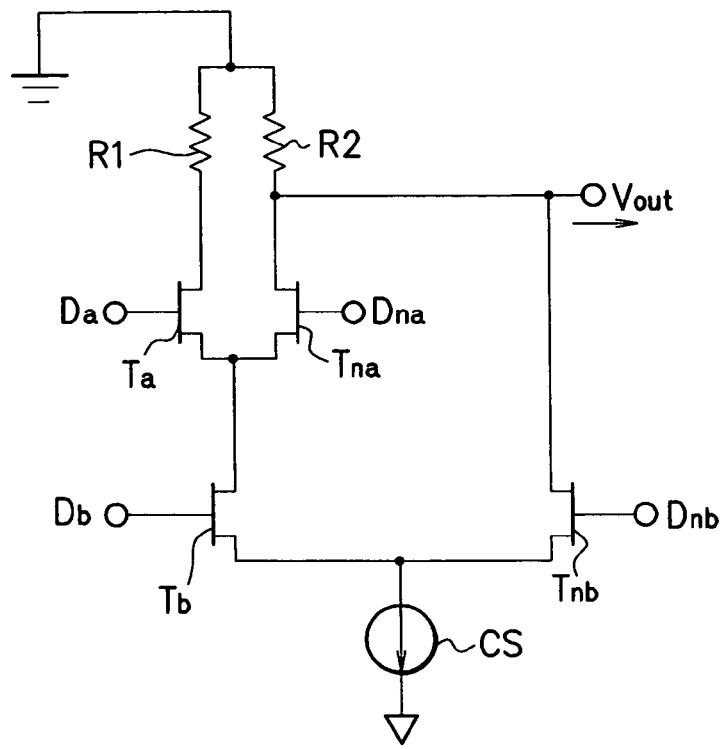
FIG. 6 is a circuit diagram that shows a configuration of an AND circuit.

FIG. 6 is a circuit diagram showing the configuration of an AND circuit. The first input differential signals, which are mutually inverted, are inputted to terminals Da and Dna. In other words, when the HIGH level is inputted to the terminal Da, the LOW level is inputted to the terminal Dna and when the LOW level is inputted to the terminal Da, the HIGH level is inputted to the terminal Da. The second input differential signals, which are mutually inverted, are inputted to terminals Db and Dnb. Field effect transistors Ta and Tna constitute the first differential pair and field effect transistors Tb and Tnb constitute the second differential pair. From an output terminal Vout, an AND signal of the first and second input differential signals is output.

In the transistor Ta, the gate is connected to the input terminal Da, the drain is connected to a first reference potential (for example, the ground) via a resistor R1, and the source is connected to the drain of the transistor Tb. In the transistor Tna, the gate is connected to the input terminal Dna, the drain is connected to the first reference potential via a resistor R2, and the source is connected to the drain of the transistor Tb. In the transistor Tb, the gate is connected to the input terminal Db and the source is connected to a second reference potential (for example, a negative potential) via a current source CS. In the transistor Tnb, the gate is connected to the input terminal Dnb, the drain is connected to the drain of the transistor Tna, and the source is connected to the second reference potential via the current source CS. The output terminal Vout is connected to the drain of the transistor Tna.

A case where the LOW level is inputted to the input terminals Da and Db is explained below. In this case, the HIGH level is inputted to the input terminals Dna and Dnb. The transistors Ta and Tb turn off and the transistors Tna and Tnb turn on. Since the transistor Tnb turns on, the output terminal Vout becomes the LOW level.

Next, a case where the LOW level is inputted to the input terminal Da and the HIGH level is inputted to the input terminal Db is explained below. In this case, the HIGH level is inputted to the input terminal Dna and the LOW level is inputted to the input terminal Dnb. The transistors Ta and Tnb turn off and the transistors Tna and Tb turn on. Since the transistors Tna and Tb turn on, the output terminal Vout becomes the LOW level.

Next, a case where the HIGH level is inputted to the input terminal Da and the LOW level is inputted to the input terminal Db is explained below. In this case, the LOW level is inputted to the input terminal Dna and the HIGH level is inputted to the input terminal Dnb. The transistors Tb and Tna turn off and the transistors Ta and Tnb turn on. Since the transistor Tnb turns oh, the output terminal Vout becomes the LOW level.

Next, a case where the HIGH level is inputted to the input terminals Da and Db is explained below. In this case, the LOW level is inputted to the input terminals Dna and Dnb. Since the transistors Ta and Tb turn on and the transistors Tna and Tnb turn off, the output terminal Vout becomes the HIGH level.

In this circuit, however, the load state of the transistor Tb and the load state of the transistor Tnb are different from each other. In other words, the transistor Tb is connected to the first reference potential via the transistor Ta or Tna and the resistor R1 or R2 connected in series. In contrast to this, the transistor Tnb is connected to the first reference potential via the resistor R2. Therefore, ringing is caused in the output waveform Vout at the output terminal Vout, the waveform is deteriorated, and the fast operation does not stabilize. The circuit shown in FIG. 7 may be a solution to the problem.

Figure 7:
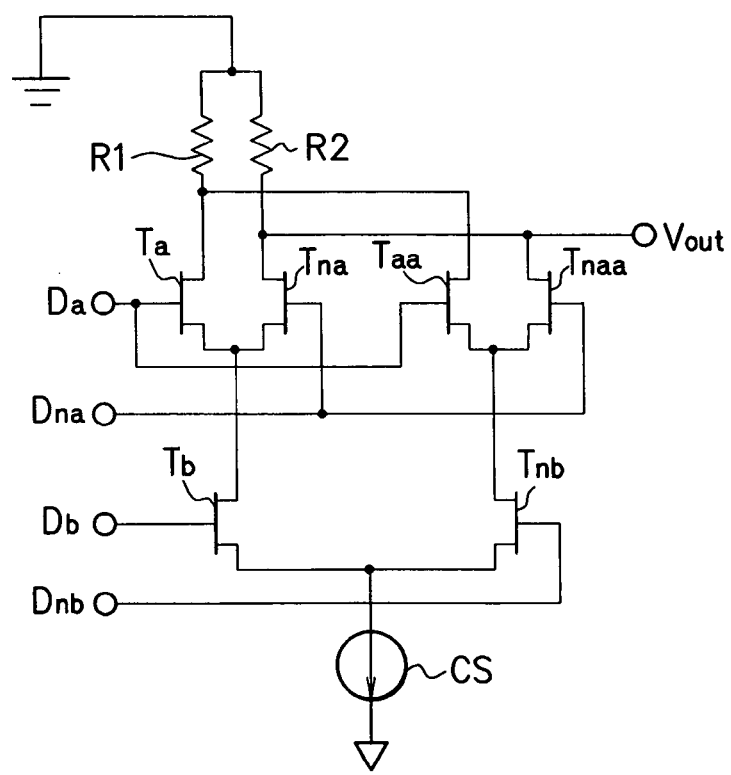
FIG. 7 is a circuit diagram that shows a configuration of another AND circuit.

FIG. 7 is a circuit diagram showing the configuration of another AND circuit. The circuit in FIG. 7 is configured by adding field effect transistors Taa and Tnaa to the circuit in FIG. 6. In the transistor Taa, the gate is connected to the input terminal Da, the drain is connected to the drain of the transistor Ta, and the source is connected to the drain of the transistor Tnb. In the transistor Tnaa, the gate is connected to the input terminal Dna, the drain is connected to the drain of the transistor Tna, and the source is connected to the drain of the transistor Tnb.

In this circuit, it is possible to keep the load balance between the transistors Tb and Tnb by providing the differential pair of transistors Taa and Tnaa also between the transistor Tnb and the first reference potential. On the other hand, in order to maintain the logic of the AND operation, the gates of the transistors Ta and Taa are connected and the gates of the transistors Tna and Tnaa are connected. Therefore, the input capacitance of the input terminals Da and Dna is doubled compared to the case of the circuit in FIG. 6 (fan-out 2), resulting in the reduction in the switching speed of the transistors Ta, Tna, Taa, and Tnaa. The circuit shown in FIG. 8 may be a solution to the problem.

Figure 8:
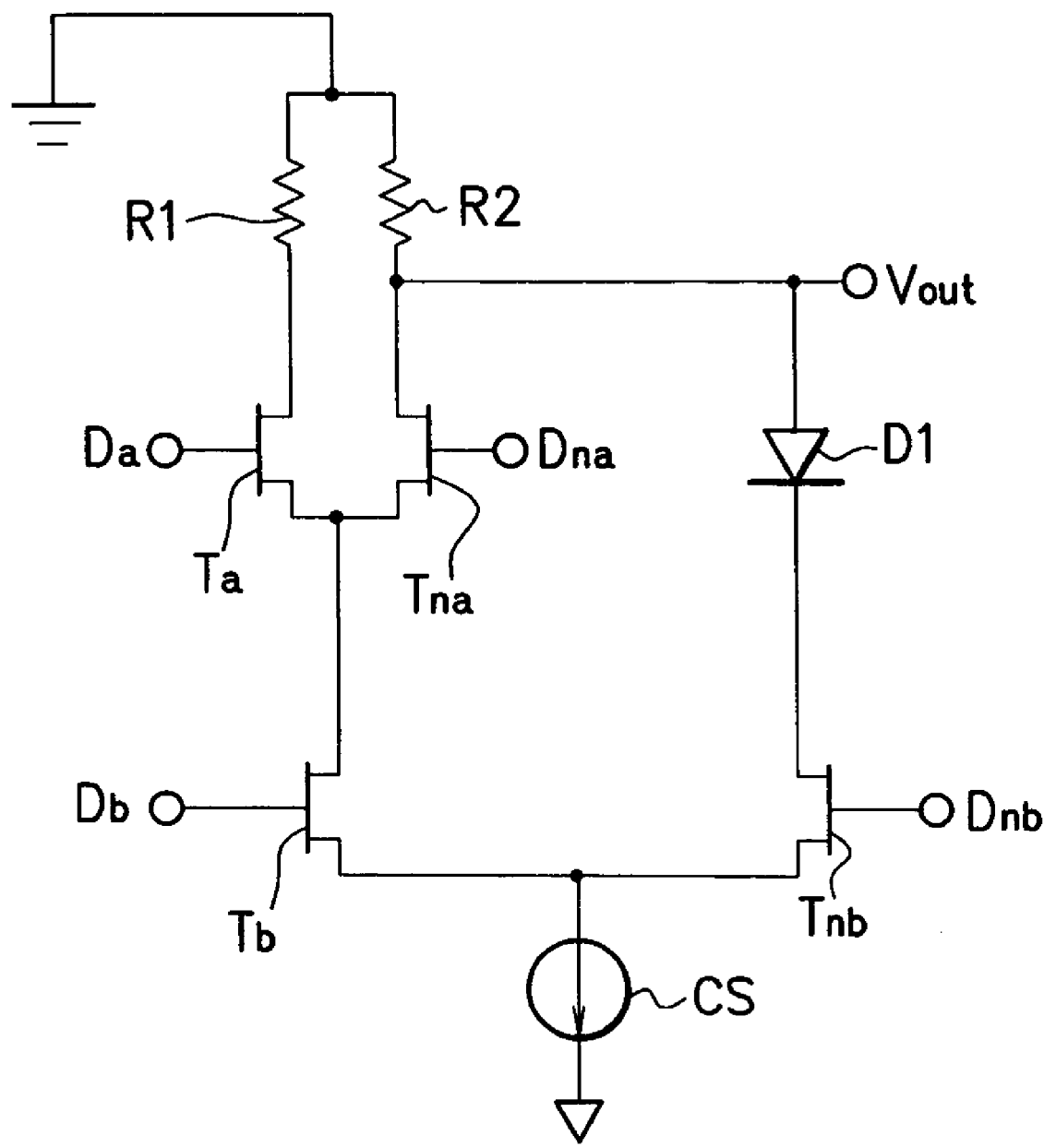
FIG. 8 is a circuit diagram that shows a configuration of still another AND circuit.

FIG. 8 is a circuit diagram showing the configuration of another AND circuit. The circuit in FIG. 8 is configured by adding a level shift diode D1 to the circuit in FIG. 6. In the diode D1, the anode is connected to the drain of the transistor Tna and the cathode is connected to the drain of the transistor Tnb.

In this circuit, it is possible to reduce the input capacitance while keeping the load balance between the transistors Tb and Tnb so that the fan-out of the input terminals Da and Dna remains 1 by adding the level shift diode D1. Therefore, the switching speed of the transistors Ta and Tna can be prevented from being reduced without the deterioration of output waveform at the output terminal Vout. It is not possible, however, for the level shift diode D1 to reduce the mirror capacitance of the transistor Tnb (the gate-drain capacitance), as is possible by the differential pair of transistors Taa and Tnaa shown in the circuit in FIG. 7. Therefore, the switching speed of the differential pair of transistors Tb and Tnb cannot be increased.

Figure 1:
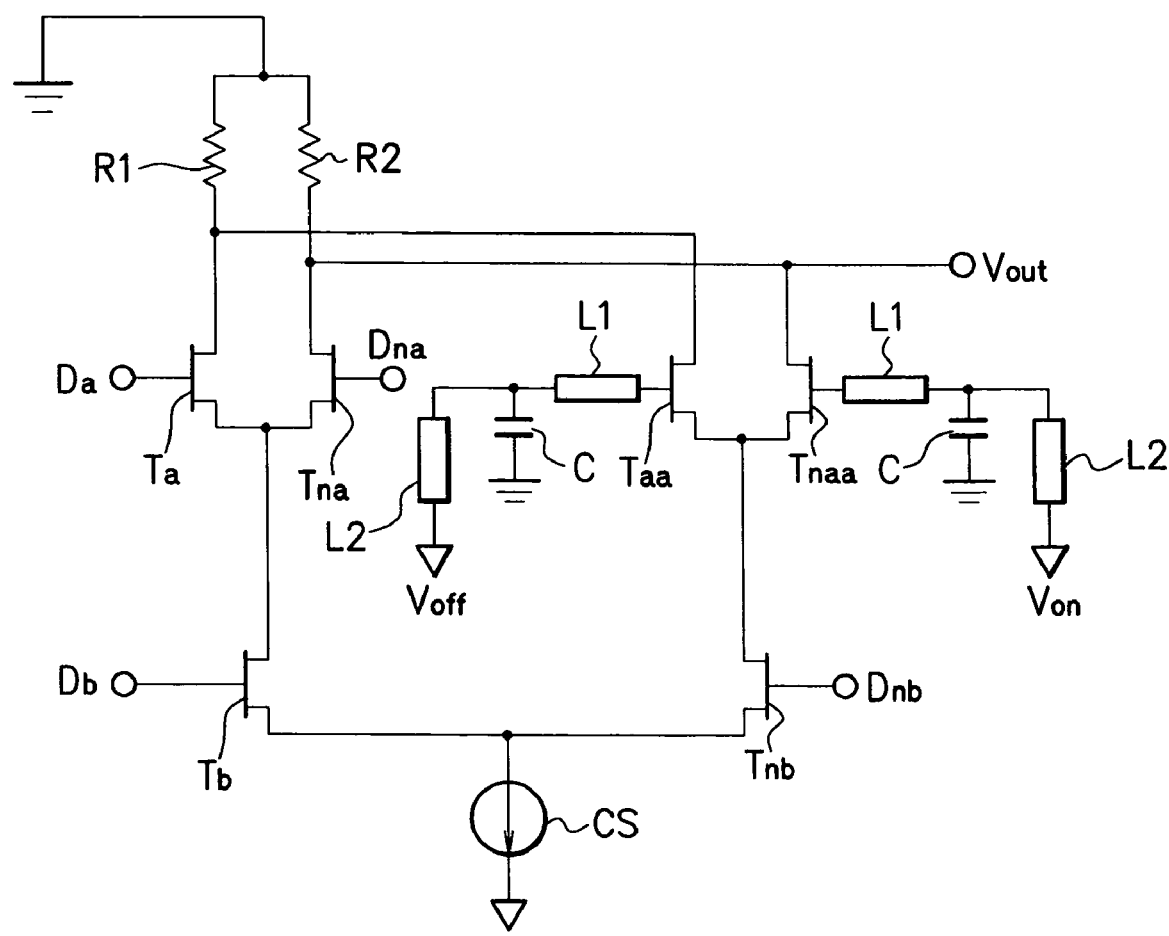
FIG. 1 is a circuit diagram that shows a configuration example of an AND circuit according to an embodiment of the present invention.

FIG. 1 is a circuit diagram showing a configuration example of the AND circuit in the embodiment of the present invention. The first input differential signals, which are mutually inverted, are inputted to the terminals Da and Dna. The second input differential signals, which are mutually inverted, are inputted to the terminals Db and Dnb. The field effect transistors Ta and Tna constitute the first differential pair, the field effect transistors Taa and Tnaa constitute the second differential pair, and the field effect transistors Tb and Tnb constitute the third differential pair. From the output terminal Vout, the AND signal of the first and second input differential signals is output.

In the transistor Ta, the gate is connected to the input terminal Da, the drain is connected to the first reference potential (for example, the ground) via the resistor R1, and the source is connected to the drain of the transistor Tb. In the transistor Tna, the gate is connected to the input terminal Dna, the drain is connected to the first reference potential via the resistor R2, and the source is connected to the drain of the transistor Tb.

In the transistor Taa, the gate is connected to a fixed bias (a direct current voltage) Voff via wiring L1 and L2, the drain is connected to the first reference potential via the resistor R1, and the source is connected to the drain of the transistor Tnb. In the transistor Tnaa, the gate is connected to a fixed bias Von via the wiring L1 and L2, the drain is connected to the first reference potential via the resistor R2, and the source is connected to the drain of the transistor Tnb.

The gates of the transistors Taa and Tnaa are connected to the first reference potential via a capacitor C for a high-frequency short circuit. The wiring L1 is provided between the gate of the transistor Taa and the capacitor C and the wiring L1 is provided also between the gate of the transistor Tnaa and the capacitor C. It is preferable that the length of the wiring L1 be less than or equal to one tenth of the wavelength of a signal at the output terminal Vout. In the UWB (Ultra Wide Band) communication, an extremely short pulse having a half value width of 10 ps or less is required. A pulse having a half value width of 10 ps corresponds to a frequency of 1,000 GHz. When a signal at the output terminal OUT has a frequency of 100 GHz, it is preferable that the length of the wiring L1 be less than or equal to 100 µm. Moreover, it is preferable that the capacitor C have a capacitance of 1 pF or more. By providing the capacitor C, the high-frequency signal at the output terminal OUT can be short-circuited to the first reference ground and it is possible to prevent the high-frequency signal from adversely affecting the fixed biases Voff and Von. By reducing the length of the wiring L1, the high-frequency signal can be short-circuited to the first reference potential.

In the transistor Tb, the gate is connected to the input terminal Db, the source is connected to the second reference potential (for example, a negative potential) via the current source CS. In the transistor Tnb, the gate is connected to the input terminal Dnb and the source is connected to the second reference potential via the current source CS. The output terminal Vout is connected to the drains of the transistors Tna and Tnaa.

For example, the first reference voltage is 0V and the second reference potential is −3.3V. The fixed bias Voff is a bias to keep the transistor Taa off all the times and has, for example, a potential of −1.7V. The fixed bias Von is a bias to keep the transistor Tnaa on all the times and has, for example, a potential of −1.3V.

A case where the LOW level is inputted to the input terminals Da and Db is explained below. In this case, the HIGH level is inputted to the input terminals Dna and Dnb. The transistors Ta and Tb turn off and the transistors Tna and Tnb turn on. Since the transistor Tnb turns on, the output terminal Vout becomes the LOW level.

Next, a case where the LOW level is inputted to the input terminal Da and the HIGH level is inputted to the input terminal Db is explained below. In this case, the HIGH level is inputted to the input terminal Dna and the LOW level is inputted to the input terminal Dnb. The transistors Ta and Tnb turn off and the transistors Tna and Tb turn on. Since the transistors Tna and Tb turn on, the output terminal Vout becomes the LOW level.

Next, a case where the HIGH level is inputted to the input terminal Da and the LOW level is inputted to the input terminal Db is explained below. In this case, the LOW level is inputted to the input terminal Dna and the HIGH level is inputted to the input terminal Dnb. The transistors Tb and Tna turn off and the transistors Ta and Tnb turn on. Since the transistor Tnb turns on, the output terminal Vout becomes the LOW level.

Next, a case where the HIGH level is inputted to the input terminals Da and Db is explained below. In this case, the LOW level is inputted to the input terminals Dna and Dnb. Since the transistors Ta and Tb turn on and the transistors Tna and Tnb turn off, the output terminal Vout becomes the HIGH level.

The first characteristic of the present embodiment is that the differential pair of transistors Taa and Tnaa is provided. The differential pair of transistors Taa and Tnaa is connected to the load side of the transistor Tnb. The fixed biases Voff and Von are supplied to the transistors Taa and Tnaa, respectively, so that the transistor Taa is off all the times and the transistor Tnaa is on all the times.

The second characteristic of the present embodiment is that the capacitor C for a high-frequency short circuit is provided. The capacitors C for a high-frequency short circuit are provided to the gates of the transistors Taa and Tnaa, respectively, to which the fixed biases are supplied. It is preferable that the length of the wiring L1 between the gate and the capacitor C be less than or equal to one tenth of the wavelength of a signal (an electrical length) at the output terminal Vout.

Since it is possible to keep the load balance between the transistors Tb and Tnb by providing the transistors Taa and Tnaa, the deterioration of waveform such as ringing in the output waveform at the output terminal Vout can be prevented. Moreover, in the present embodiment, the gates of the transistors Ta and Taa are connected but the gates of the transistors Tna and Tnaa are not connected, as shown in the circuit in FIG. 7, therefore, the fan-out of the input terminals Da and Dna remains 1 and the input capacitance can be reduced. Due to this, it is possible to increase the switching speed of the transistors Ta and Tna. Still moreover, in the present embodiment, compared to the case where the diode D1 is provided in the circuit in FIG. 8, the gate-drain mirror capacitance of the transistor Tnb can be reduced and the switching speed of the differential pair of transistors Tb and Tnb can be increased.

On the other hand, the lengths of the wiring L1 and L2 from the gates of the transistors Taa and Tnaa to the supply pad of the first reference potential will be hundreds of micrometers, or as long as about 1 mm in the worst-case scenario, because of the requirements of cell layout. Therefore, if the length of the wiring L1 between the capacitor C and the gate is great, the high-frequency signal, which has leaked out to the wiring L1 via the gate-drain capacitance of the transistors Taa and Tnaa, causes a standing-wave at a frequency depending on the length of the wiring L1. This considerably reduces the gain particularly in the frequency region of 100 GHz or higher. By providing the capacitor C so that the length of the wiring L1 is less than or equal to one tenth of the wavelength of a 100 GHz signal, the gain can be obtained even in the region of 100 GHz or higher. By the way, the allowable length of the wiring L1 differs according to the conditions of implementation (the distance between wiring and a substrate, the dielectric constant of an interlayer insulating film, etc.), therefore, a strictly accurate value cannot be determined, but it is preferable that the length of the wiring L1 be less than or equal to 100 μm when the frequency of the signal at the output terminal Vout is 100 GHz.

Next, an example in which the technique of the HEMT (High Electron Mobility Transistor) of InP having a gate length of 0.1 μm is used for the transistors Ta, Tna, Taa, Tnaa, Tb, and Tnb is explained below with reference to FIG. 2 to FIG. 5.

Figure 2:
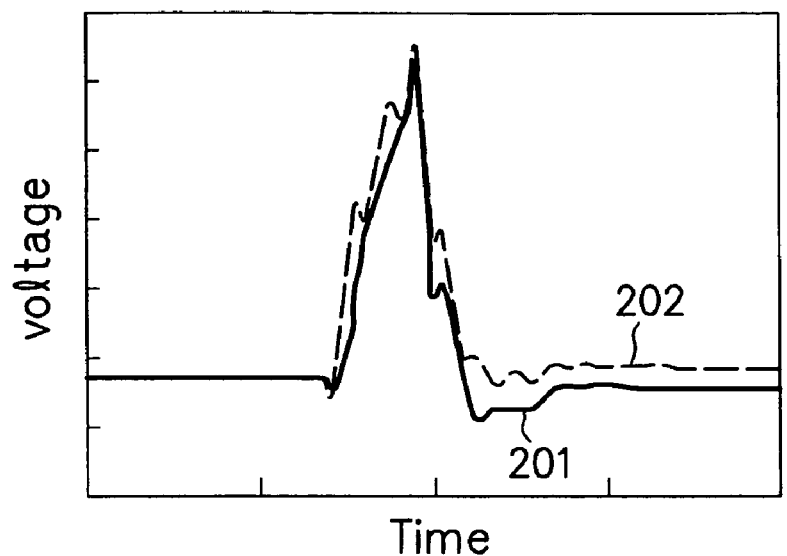
FIG. 2 is a diagram that compares an output pulse waveform in a circuit according to the present embodiment in FIG. 1 with that in a circuit in FIG. 6.

FIG. 2 is a diagram showing a comparison between the output pulse waveform in the circuit in the present embodiment in FIG. 1 and that in the circuit in FIG. 6. A waveform 201 shows the output pulse waveform output from the output terminal Vout of the circuit in the present embodiment in FIG. 1. A waveform 202 shows the output pulse waveform output from the output terminal Vout of the circuit in FIG. 6. In the circuit in FIG. 6, because of the imbalance between the load of the transistor Tb and the load of the transistor Tnb, ringing is caused in the output pulse, as shown in the waveform 202, and therefore, the waveform is deteriorated. Due to this, the pulse width becomes wide and the fast communication is made difficult. In the circuit in FIG. 1, the load balance between the transistors Tb and Tnb is kept by providing the differential pair of transistors Taa and Tnaa, therefore, ringing is not caused, as shown in the waveform 201, and the deterioration of waveform can be prevented. Moreover, the pulse width becomes narrow in the waveform 201 and the fast communication is made possible.

Figure 3:
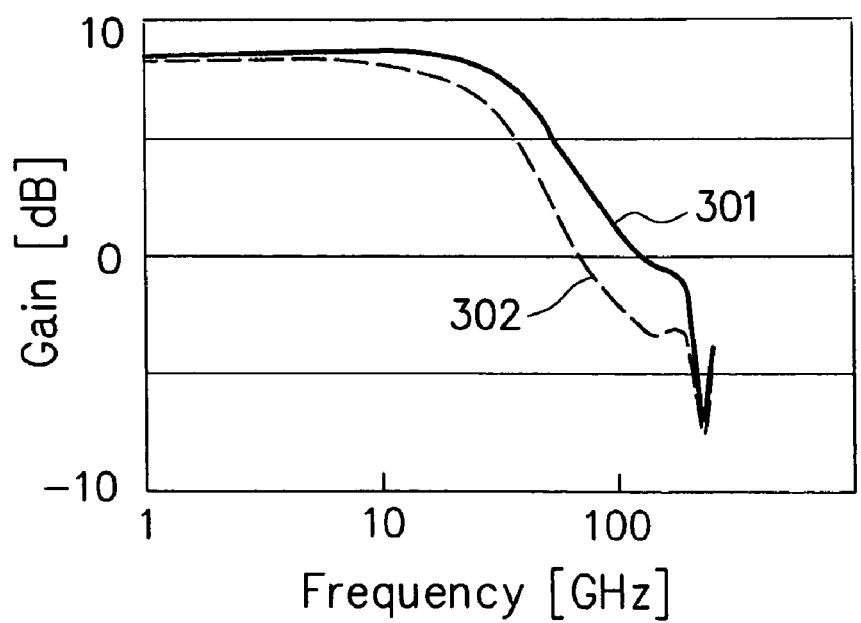
FIG. 3 is a diagram that shows the frequency characteristics, which are the small-signal analysis results, of a transistor Tna in the circuit according to the present embodiment in FIG. 1 and of that in a circuit in FIG. 7.

FIG. 3 is a diagram showing the frequency characteristics, which are the small-signal analysis results, of the transistor Tna in the circuit in the present embodiment in FIG. 1 and in the circuit in FIG. 7. A characteristic 301 shows the frequency characteristic of an output signal output from the output terminal Vout of the circuit in the present embodiment in FIG. 1. A characteristic 302 shows the frequency characteristic of an output signal output from the output terminal Vout of the circuit in FIG. 7. In the circuit in FIG. 1, since the transistors Ta and Tna can be driven at a high speed, a high gain can be maintained even at a high frequency compared to the circuit in FIG. 7.

FIG. 4 is a diagram showing the frequency characteristics, which are the small-signal analysis results, of the transistor Tnb in the circuit in the present embodiment in FIG. 1 and in the circuit in FIG. 8. A characteristic 401 shows the frequency characteristic of an output signal output from the output terminal Vout of the circuit in the present embodiment in FIG. 1. A characteristic 402 shows the frequency characteristic of an output signal output from the output terminal Vout of the circuit in FIG. 8. In the circuit in FIG. 1, since the transistor Tna can be driven at a high speed, a high gain can be maintained even at a high frequency compared to the circuit in FIG. 8.

FIG. 5 is a diagram showing the frequency characteristics, which are the small-signal analysis results, of the transistor Tnb in the circuit in the present embodiment in FIG. 1. A characteristic 501 shows the frequency characteristic when the length of the wiring L1 is 100 μm. A characteristic 502 shows the frequency characteristic when the length of the wiring L1 is 300 μm. As shown in the characteristic 502, when the length of the wiring L1 is 300 μm, a resonance point appears near 100 GHz and the gain rapidly decreases in the frequency region of 100 GHz or higher. In contrast to this, as shown in the characteristic 501, when the length of the wiring L1 is 100 μm, the resonance point disappears, the region in which the gain is maintained is extended, and a high gain can be maintained even at a high frequency. In other words, by setting the length of the wiring L1 less than or equal to 100 μm, the operation of the AND circuit can be made faster compared to the case where the length is 300 μm.

As described above, in the present embodiment, the first and second transistors Ta and Tna, to which the first input differential signal is inputted, constitute the first differential pair. The third and fourth transistors Taa and Tnaa, to which the fixed bias is inputted, constitute the second differential pair. The fifth and sixth transistors Tb and Tnb, to which the second input differential signal is inputted, constitute the third differential pair. The first differential pair is connected to the fifth transistor Tb and the second differential pair is connected to the sixth transistor Tnb. The output terminal Vout is connected to the first transistor Ta or the second transistor Tna and outputs the AND signal or the NAND signal of the first and second input differential signals. If the output terminal Vout is connected to the drain of the transistor Ta, the NAND signal is output from the output terminal Vout.

Since it is possible to keep the balance between the load of the fifth transistor Tb and the load of the sixth transistor Tnb by providing the second differential pair in accordance with the first differential, the deterioration of waveform such as ringing in the output waveform at the output terminal Vout can be prevented. Moreover, when the first input differential signal is inputted to both the first and the second differential pairs, as shown in the circuit in FIG. 7, a problem is caused in that the input capacitance becomes large and the switching speed of the first and second differential pairs is reduced. In contrast to this, if the fixed biases Voff and Von are inputted to the second differential pair and the first input differential signal is inputted to only the first differential pair, the input capacitance becomes small and the switching speed of the first differential pair is increased. Due to this, the output pulse width at the output terminal Vout can be reduced.

One of applications of the AND circuit is the UWB communication system. The AND circuit in the present embodiment can be applied as a super-fast integrated circuit to be used in the UWB communication system etc. The UWB communication system requires an extremely short pulse having a half value width of 10 ps or less. Since it is possible for the AND circuit in the present embodiment to make faster the operations of the differential pair of transistors Ta and Tna and the differential pair of transistors Tb and Tnb, the AND circuit can output an extremely short pulse having a half value width of 10 ps or less and can be applied to the UWB communication system.

Although an example in which a field effect transistor is used is explained in the present embodiment, a bipolar transistor may be used instead of a field effect transistor. In this case, the gate (input terminal), drain (first terminal), and source (second terminal) of a field effect transistor correspond to the base, collector, and emitter of a bipolar transistor, respectively.

The embodiments described above are each only the concrete examples in embodying the present invention and the scope of the technology of the present invention should not be interpreted limitedly. In other words, various modifications may be embodied without departing from the concept of the technology or the main characteristics of the present invention.

Since it is possible to keep the balance between the load of the fifth transistor and the load of the sixth transistor by providing the second differential pair in accordance with the first differential, the deterioration of output waveform such as ringing in the output waveform at the output terminal can be prevented. Moreover, when the first input differential signal is inputted to both the first and the second differential pairs, a problem is caused in that the input capacitance becomes large and the switching speed of the first and second differential pairs is reduced. In contrast to this, if a fixed bias is inputted to the second differential pair and the first input differential signal is inputted to only the first differential pair, the input capacitance becomes small and the switching speed of the first differential pair is increased. Due to this, the output pulse width at the output terminal can be reduced.

What is claimed is:

1. An AND circuit comprising:
a first differential pair including a first transistor and a second transistor, to which a first input differential signal is inputted;
a second differential pair including a third transistor and a fourth transistor, to which a fixed bias is inputted;
a third differential pair including a fifth transistor and a sixth transistor, to which a second input differential signal is inputted, and in which said first differential pair is connected to said fifth transistor and said second differential pair is connected to said sixth transistor;
an output terminal connected to said first or second transistor and outputting an AND signal or a NAND signal of said first and second input differential signals; and
two capacitors connected to the input terminals of said third and fourth transistors, respectively.

2. The AND circuit according to claim 1, wherein the distance between said capacitor and the input terminal of said transistor is less than or equal to one tenth of the wavelength of a signal at said output terminal.

3. The AND circuit according to claim 1, wherein the distance between said capacitor and the input terminal of said transistor is less than or equal to 100 μm.

4. The AND circuit according to claim 1, wherein the capacitance of said capacitor is greater than or equal to 1 pF.

5. The AND circuit according to claim 1, wherein a fixed bias is inputted to the input terminal of one of said third and fourth transistors in order to turn on the transistor and a fixed bias is inputted to the input terminal of the other transistor in order to turn off the transistor.

6. The AND circuit according to claim 1, further comprising a current source connected to said third differential pair.

7. The AND circuit according to claim 1, further comprising two resistors connected to said first and second transistors, respectively.

8. The AND circuit according to claim 1, wherein:
in said first transistor, a first terminal is connected to a first reference potential via a first resistor and a second terminal is connected to a first terminal of said fifth transistor;
in said second transistor, a first terminal is connected to said first reference potential via a second resistor and a second terminal is connected to the first terminal of said fifth transistor;
in said third transistor, a first terminal is connected to said first reference potential via said first resistor and a second terminal is connected to a first terminal of said sixth transistor;

in said fourth transistor, a first terminal is connected to said first reference potential via said second resistor and a second terminal is connected to the first terminal of said sixth transistor;

in said fifth transistor, a second terminal is connected to a second reference potential via a current source; and in said sixth transistor, a second terminal is connected to said second reference potential via said current source.

9. The AND circuit according to claim 8, wherein a fixed bias is inputted to the input terminal of one of said third and fourth transistors in order to turn on the transistor and a fixed bias is inputted to the input terminal of the other transistor in order to turn off the transistor.

10. The AND circuit according to claim 8, wherein the distance between said capacitor and the input terminal of said transistor is less than or equal to 100 μm.

11. The AND circuit according to claim 1, wherein said first to sixth transistors are field effect transistors.

12. The AND circuit according to claim 11, wherein:

in said first transistor, the drain is connected to a first referential potential via a first resistor and the source is connected to the drain of said fifth transistor;

in said second transistor, the drain is connected to said first reference potential via a second resistor and the source is connected to the drain of said fifth transistor;

in said third transistor, the drain is connected to said first reference potential via said first resistor and the source is connected to the drain of said sixth transistor;

in said fourth transistor, the drain is connected to said first reference potential via said second resistor and the source is connected to the drain of said sixth transistor;

in said fifth transistor, the source is connected to a second reference potential via a current source; and in said sixth transistor, the source is connected to said second reference potential via said current source.

13. The AND circuit according to claim 12, wherein a fixed bias is inputted to the gate of one of said third and fourth transistors in order to turn on the transistor and a fixed bias is inputted to the gate of the other transistor in order to turn off the transistor.

14. The AND circuit according to claim 11, wherein the distance between said capacitor and the gate of said transistor is less than or equal to 100 μm.

15. The AND circuit according to claim 1, wherein said first to sixth transistors are bipolar transistors.

16. The AND circuit according to claim 15, wherein:

in said first transistor, the collector is connected to a first referential potential via a first resistor and the emitter is connected to the collector of said fifth transistor;

in said second transistor, the collector is connected to said first reference potential via a second resistor and the emitter is connected to the collector of said fifth transistor;

in said third transistor, the collector is connected to said first reference potential via said first resistor and the emitter is connected to the collector of said sixth transistor;

in said fourth transistor, the collector is connected to said first reference potential via said second resistor and the emitter is connected to the collector of said sixth transistor;

in said fifth transistor, the emitter is connected to a second reference potential via a current source; and in said sixth transistor, the emitter is connected to said second reference potential via said current source.

17. The AND circuit according to claim 16, wherein a fixed bias is inputted to the base of one of said third and fourth transistors in order to turn on the transistor and a fixed bias is inputted to the base of the other transistor in order to turn off the transistor.

18. The AND circuit according to claim 15, wherein the distance between said capacitor and the base of said transistor is less than or equal to 100 μm.

* * * * *